United States Patent
Kwak et al.

(10) Patent No.: US 9,048,446 B2
(45) Date of Patent: Jun. 2, 2015

(54) ORGANIC LIGHT EMITTING DEVICE

(71) Applicant: SAMSUNG DISPLAY CO., LTD., Yongin, Gyeonggi-Do (KR)

(72) Inventors: Jae-Hyun Kwak, Yongin-si (KR); Ji-Hyun Seo, Yongin-si (KR); Hwan-Hee Cho, Yongin-si (KR); Young-Ho Park, Yongin-si (KR); Moon-Jae Lee, Yongin-si (KR); Chang-Woong Chu, Yongin-si (KR); Kwan-Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 66 days.

(21) Appl. No.: 13/928,326

(22) Filed: Jun. 26, 2013

(65) Prior Publication Data

US 2014/0117325 A1     May 1, 2014

(30) Foreign Application Priority Data

Oct. 30, 2012    (KR) .................. 10-2012-0121193

(51) Int. Cl.
*H01L 51/05*    (2006.01)
*H01L 51/00*    (2006.01)
*H01L 51/50*    (2006.01)

(52) U.S. Cl.
CPC ......... *H01L 51/5004* (2013.01); *H01L 51/5016* (2013.01); *H01L 51/5096* (2013.01); *H01L 2251/552* (2013.01); *H01L 51/0059* (2013.01); *H01L 51/0072* (2013.01)

(58) Field of Classification Search
CPC ............ H01L 51/0545; H01L 51/0036; H01L 51/0541; H01L 51/5012; B82Y 10/00
USPC ........................................................ 257/40
See application file for complete search history.

(56) References Cited

U.S. PATENT DOCUMENTS

| | | | |
|---|---|---|---|
| 6,818,329 B1 | 11/2004 | Liao et al. | |
| 2003/0178619 A1* | 9/2003 | Forrest et al. | 257/40 |
| 2007/0034859 A1 | 2/2007 | Tierney et al. | |
| 2008/0191621 A1* | 8/2008 | Ha et al. | 313/506 |
| 2010/0084647 A1* | 4/2010 | Kondakova et al. | 257/40 |
| 2010/0331509 A1 | 12/2010 | Zhang et al. | |

FOREIGN PATENT DOCUMENTS

| | | |
|---|---|---|
| KR | 10-2005-0109584 A | 11/2005 |
| KR | 10-2006-0090690 A | 8/2006 |
| KR | 10-2010-0103837 A | 9/2010 |

OTHER PUBLICATIONS

Park, Jung Soo et al.; Realization of improved efficient White-Organic Light Emitting Diodes with a Thin Electron Blocking Layer; journal; J.S. Park, Seoul, Korea, 3 pages.

* cited by examiner

*Primary Examiner* — Steven Loke
*Assistant Examiner* — Didarul Mazumder
(74) *Attorney, Agent, or Firm* — Christie, Parker & Hale, LLP

(57) ABSTRACT

An organic light emitting device is described. The organic light emitting device includes: a substrate; a first electrode on the substrate; an emission layer on the first electrode; a second electrode on the emission layer; and an exciton blocking layer between the first electrode and the emission layer, in which a LUMO energy level of the exciton blocking layer is higher than a LUMO energy level of the emission layer.

11 Claims, 3 Drawing Sheets

*130 (130R, 130G, 130G)

*130 (130R, 130G, 130G)

ORGANIC LIGHT EMITTING DEVICE

CROSS-REFERENCE TO RELATED APPLICATION

This application claims priority to and the benefit of Korean Patent Application No. 10-2012-0121193, filed on Oct. 30, 2012, with the Korean Intellectual Property Office, the present disclosure of which is incorporated herein in its entirety by reference.

TECHNICAL FIELD

The present disclosure relates to an organic light emitting device, and more particularly, to an organic light emitting device including an exciton blocking layer to prevent or reduce leakage of an exciton generated in a green phosphorescent emission layer.

BACKGROUND

Organic light emitting devices may have properties, such as low voltage driving, having a light and thin film structure, wide viewing angle, or rapid response speed.

SUMMARY

According to aspects of embodiments of the present disclosure, a number of excitons in a green phosphorescent emission layer may be increased by preventing or reducing endothermic energy transfer in which the excitons are leaked to the hole transport layer from the green phosphorescent emission layer, thereby increasing light emission efficiency of the green phosphorescent emission layer.

An exemplary embodiment of the present disclosure provides an organic light emitting device, including: a substrate; a first electrode on the substrate; an emission layer on the first electrode; a second electrode on the emission layer; and an exciton blocking layer between the first electrode and the emission layer, in which a LUMO energy level of the exciton blocking layer is higher than a LUMO energy level of the emission layer.

In some embodiments, the emission layer includes a red emission layer, a green emission layer, and a blue emission layer. In some embodiments, the exciton blocking layer may be between the first electrode and the green emission layer.

A hole transport layer (HTL) may be between the first electrode and the exciton blocking layer, and a LUMO energy level of the hole transport layer (HTL) may be lower than the LUMO energy level of the exciton blocking layer.

The difference between the LUMO energy level of the exciton blocking layer and a LUMO energy level of the green emission layer may be from 0.2 eV to 0.5 eV.

The difference between the LUMO energy level of the hole transport layer and the LUMO energy level of the exciton blocking layer may be from 0.2 eV to 0.5 eV.

A hole injection layer (HIL) may be included between the first electrode and the hole transport layer.

Any one of an electron transport layer (ETL) and an electron injection layer (EIL) may be included between the emission layer and the second electrode.

The exciton blocking layer may contain an compound represented by Chemical Formula 1 or Chemical Formula 2.

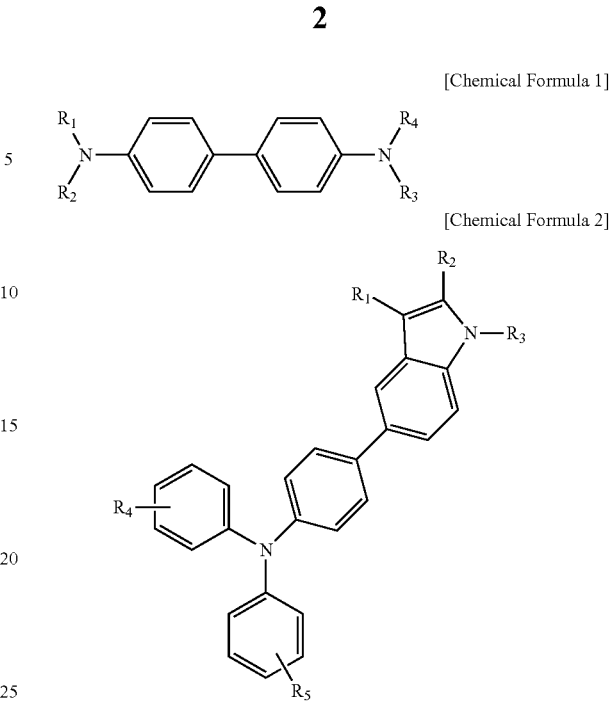

[Chemical Formula 1]

[Chemical Formula 2]

(In Chemical Formula 1 and Chemical Formula 2, $R_1$ to $R_5$ may each be independently selected from the group consisting of hydrogen, deuterium, a halogen, nitro, cyano, a substituted or unsubstituted C3 to C20 heterocyclic aryl group, a fullerene, a substituted or unsubstituted C1 to C24 alkyl silyl group, and a substituted or unsubstituted C6 to C40 aryl silyl group.)

The green emission layer may contain a phosphorescent host material and a phosphorescent dopant material doped on the phosphorescent host material.

A material in the exciton blocking layer may have a triplet energy level, and the triplet energy level of the material in the exciton blocking layer may be higher than a triplet energy level of the dopant material of the green emission layer.

The difference between the triplet energy level of the material in the exciton blocking layer and the triplet energy level of the dopant material of the green emission layer may be from 0.2 eV to 0.5 eV.

According to embodiments of the organic light emitting device of the present disclosure light emission efficiency may be improved by inserting an exciton blocking layer between the hole transfer layer and the green phosphorescent emission layer to block or reduce excitons from being leaked from the green phosphorescent emission layer to the hole transfer layer.

The foregoing summary is only intended to be illustrative of embodiments of the disclosure and is not intended to be limiting in any way. In addition to the illustrative aspects, embodiments, and features described above, further aspects, embodiments, and features will become apparent by reference to the drawings, claims, and the detailed description.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
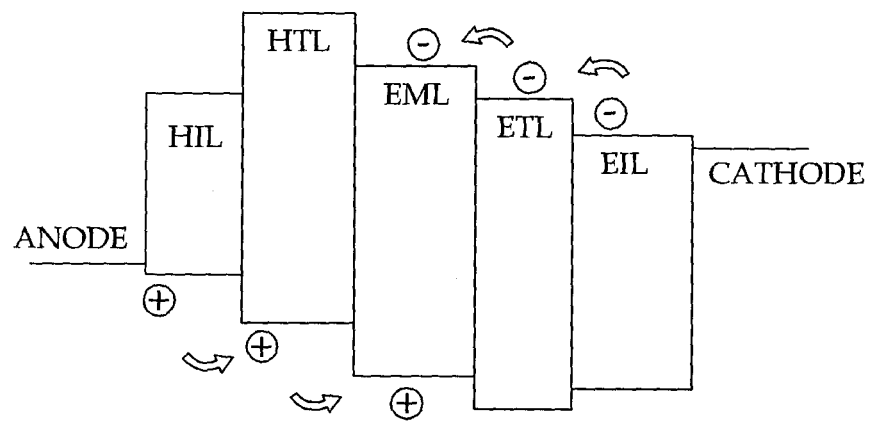
FIG. 1 is a schematic diagram illustrating an energy level of a general organic light emitting device.

In the following detailed description, only certain exemplary embodiments of the present invention are shown and described, by way of illustration. Exemplary embodiments of the present disclosure will be described in more detail with reference to the accompanying drawings. As those skilled in the art would recognize, the invention may be embodied in many different forms and should not be construed as being limited to the embodiments set forth herein in the description and the accompanying drawings.

For reference, respective components and shapes thereof are schematically drawn and may be exaggeratedly drawn in the accompanying drawings for illustration purposes. Like reference numerals designate like elements throughout the drawings.

It will be understood that when an element is referred to as being 'connected to' or 'on' another element without being referred to as being 'directly connected to' or 'directly on' the other element in the present description, it may be 'directly connected to' or 'directly on' the other element or may be 'connected to' or 'on' the other element with one or more intervening elements therebetween. Other expressions describing relationships among elements, such as 'between', 'directly between', 'adjacent to', 'directly adjacent to', and 'coupled to' may be interpreted similarly.

As illustrated in FIG. 1, organic light emitting devices may generally have an anode, a hole injection layer (HIL), a hole transport layer (HTL), an emission layer (EML), an electron transport layer (ETL), an electron injection layer (EIL), and a cathode.

The hole injection layer (HIL), the hole transport layer (HTL), the emission layer (EML), the electron transport layer (ETL), and the electron injection layer (EIL) may be made of organic compound materials. The organic compound materials are formed by covalent bonds between atomic carbons or between carbons and other atoms. Atomic orbitals (OA's) of atoms are changed into a corresponding number of molecular orbitals (MO's) by the formed covalent bonds between the atoms.

The molecular orbitals (MO's) form bonding orbitals and antibonding orbitals. A valence band is formed by coupling the bonding orbitals, and a conductive band is formed by coupling the antibonding orbitals. The highest energy level of the valence band is referred to as the highest occupied molecular orbital (HOMO), and the lowest energy level of the conductive band is referred to as the lowest unoccupied molecular orbital (LUMO).

When a voltage is applied between the anode and the cathode, holes from the anode may be injected into the emission layer (EML) through the hole injection layer (HIL) and the hole transport layer (HTL), and electrons from the cathode may be injected into the emission layer (EML) through the electron injection layer (EIL) and the electron transport layer (ETL).

The electron and the hole may recombine in the emission layer (EML) to generate an exciton. When the exciton is transitioned to a ground state, light may be emitted.

An excited state of an exciton formed when the electron and the hole recombine may be classified as a singlet excited state or a triplet excited state. When an exciton in the singlet excited state transitions to the ground state, fluorescence may be observed. When an exciton in the triplet excited state transitions to the ground state, phosphorescence may be observed.

The recombining of the electron and the hole in the emission layer (EML) to form the exciton and emit light may cause light emission efficiency to decrease by interaction between the formed excitons, particularly when only a single material is used as the emission layer. In order to improve light emission efficiency, the emission layer may include a host and a dopant doped on the host. Such an emission layer may be referred to as a host-dopant system and may improve light emission efficiency while energy is transferred from the host to the dopant.

Since the light emission efficiency of the organic light emitting device is generally proportional to the number of excitons generated in the emission layer, increasing a number of excitons in the emission layer may increase light emission efficiency.

Figure 2:
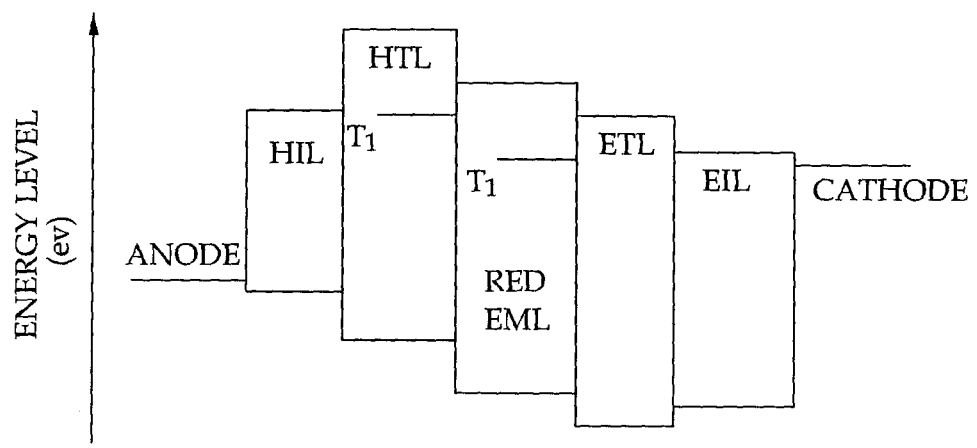
FIG. 2 is a schematic diagram illustrating an energy level of an organic light emitting device including a red phosphorescent emission layer and a hole transport layer.

FIG. 2 shows a schematic diagram illustrating an energy level of an organic light emitting device including a red phosphorescent emission layer and a hole transport layer.

Figure 3:
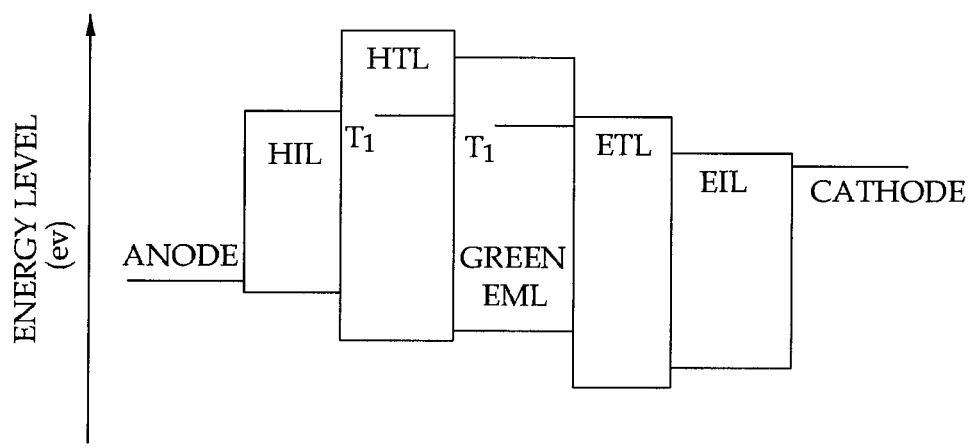
FIG. 3 is a schematic diagram illustrating an energy level of an organic light emitting device including a green phosphorescent emission layer and a hole transport layer.

FIG. 3 shows a schematic diagram illustrating an energy level of an organic light emitting device including a green phosphorescent emission layer and a hole transport layer.

In general, in an organic light emitting device having blue phosphorescent, red phosphorescent, and green phosphorescent materials each in a unit device, the red phosphorescent and green phosphorescent unit devices may transition from a triplet excited state T1 of the dopant doped on the host to a ground state S0 to emit light. As shown schematically in FIG. 2, because a T1 level of a red phosphorescent device is typically lower than a T1 level of the hole transport layer, occurrence of an endothermic energy transfer, in which excitons generated from the red phosphorescent device are leaked into the hole transport layer, may be lower than that in a green phosphorescent device.

However, as shown schematically in FIG. 3, since a green phosphorescent device has a higher T1 level compared to a red phosphorescent device, occurrence of endothermic energy transfer, in which excitons generated from the green phosphorescent device are leaked to the hole transport layer, may be higher than that in a red phosphorescent device.

Figure 4:
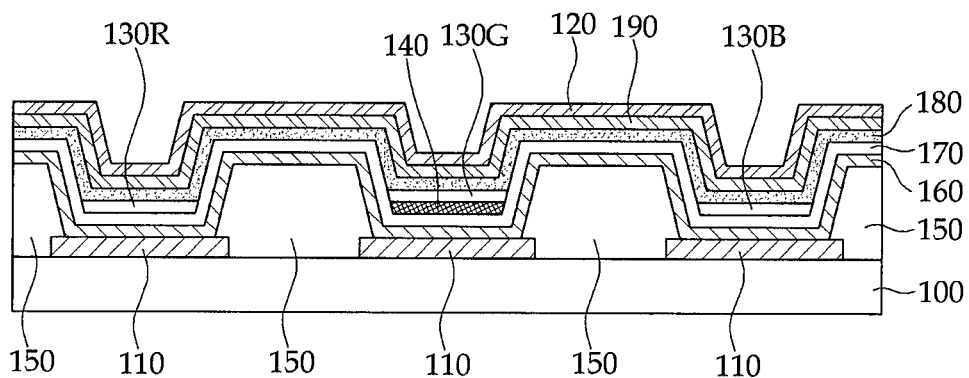
FIG. 4 is a schematic showing a cross-sectional view of an organic light emitting device according to an exemplary embodiment of the present disclosure.

FIG. 4 shows a schematic of a cross-sectional view of an organic light emitting device according to an exemplary embodiment of the present disclosure.

Referring to FIG. 4, the organic light emitting device includes a substrate 100, a first electrode 110 on the substrate 100, a second electrode 120 facing the first electrode 110, and an emission layer 130 (e.g. including 130R, 130G, and 130B) between the first electrode 110 and the second electrode 120, in which the emission layer 130 includes a red emission layer 130R, a green emission layer 130G, and a blue emission layer 130B. Here, the organic light emitting device may include an exciton blocking layer 140 between the first electrode 110 and the green emission layer 130G.

A pixel defining layer (PDL) 150, which is overlapped with an end of the first electrode 110 to partition the first electrodes 110 by a pixel unit, may be formed between the first electrodes 110.

According to some embodiments, a hole injection layer (HIL) 160 and a hole transport layer (HTL) 170 may be disposed between the first electrode 110 and the emission layer 130. According to further embodiments, an electron transport layer (ETL) 180 and an electron injection layer (EIL) 190 may be disposed between the emission layer 130 and the second electrode 120.

The substrate 100 may be made of various materials such as glass, quartz, or a transparent resin. The substrate 100 may be formed by using a flexible material. Exemplary transparent resins according to the present disclosure include but are not limited to a polyimide resin, an acrylic resin, a polyacrylate resin, a polycarbonate resin, a polyether resin, a polyethylene terephthalate resin, a sulfonic acid resin, and the like.

In embodiments wherein the organic light emitting diode display is a rear emission display, the substrate 100 should be made of a light transmitting material. In embodiments wherein the organic light emitting diode display is a front emission display, the substrate may be made of the light transmitting material or a material which does not, or substantially does not transmit light.

In embodiments wherein the organic light emitting diode is a front emission display, the first electrode 110 may be formed of at least one of gold (Au), platinum (Pt), nickel (Ni), tungsten (W), chromium (Cr), molybdenum (Mo), iron (Fe), cobalt (Co), copper (Cu), palladium (Pd), titanium (Ti), or a compound thereof. The second electrode 120 may be formed by at least one of indium tin oxide (ITO) and indium zinc oxide (IZO), which are transparent conductive oxides.

In embodiments wherein the organic light emitting diode is a rear emission display, the first electrode 110 may be formed by at least one of indium tin oxide (ITO) and indium zinc oxide (IZO), which are transparent conductive oxides having a high work function. The second electrode 120 may be formed by a metal having a low work function, for example, an alkali metal such as lithium (Li) or cesium (Cs); an alkaline earth metal such as magnesium (Mg), calcium (Ca) or strontium (Sr); or a compound including a combination thereof.

The first electrode 110 and the second electrode 120 may be formed by various suitable materials which are known in the art.

Although not specifically illustrated in FIG. 4, a thin film transistor and an insulation layer protecting the thin film transistor may be further disposed between the substrate 100 and the first electrode 110. In these embodiments, at least one thin film transistor may be formed for each pixel and may be electrically connected to the first electrode 110.

The pixel defining layer (PDL) 150, which may overlap with an end of the first electrode 110, may be formed between the first electrodes 110 to partition the first electrodes 110 by a pixel unit. The pixel defining layer 150 may serve as an insulating layer to electrically block or electrically insulate the first electrodes 110 from one another.

In some embodiments the pixel defining layer 150 may cover only a part of the upper surface of the first electrode 110, and the rest of the first electrode 110 which is not covered by the pixel defining layer 150 may form an opening. In some embodiments the emission layer 130 may be formed on a region defined by the opening. In other embodiments the emission layer 130 may be formed up to the pixel defining layer 150.

The emission layer 130 may be provided between the first electrode 110 and the second electrode 120. The emission layer 130 may include a red emission layer 130R, a green emission layer 130G, and a blue emission layer 130B.

The hole injection layer (HIL) 160 and the hole transport layer (HTL) 170 may be formed between the first electrode 110 and the emission layer 130, and the electron transport layer (ETL) 180. The electron injection layer (EIL) 190 may be formed between the emission layer 130 and the second electrode 120.

The hole injection layer 160, the hole transport layer 170, the electron transport layer 180, and the electron injection layer 190 may efficiently transfer holes or electrons to the emission layer, which may increase probability of light emission coupling in the emission layer.

In some embodiments, the hole injection layer 160 and the hole transport layer 170 are laminated so that the holes injected from the first electrode 110 may be easily transported. The hole injection layer 160 may be formed by materials including, but not limited to CuPc, a starburst type amine such as TCTA, m-MTDATA, IDE406 TPD, α-TPD, or the like. The hole transport layer 170 may be formed by suitable materials which are generally used in the art.

In some embodiments, the electron transport layer 180 and the electron injection layer 190 are laminated so that the electrons injected from the second electrode 120 may be easily transported. The electron transport layer 180 may be formed by materials including, but not limited to Alq3, PBD, TNF, BMD, BND, or the like. The electron injection layer 190 may be formed by materials including, but not limited to LiF, NaCl, CsF, $Li_2O$, BaO, or the like. In addition, the electron injection layer 190 may be formed by other suitable materials which are generally used in the art.

The emission layer 130 may include the red emission layer 130R, the green emission layer 130G, and the blue emission layer 130B. The emission layer 130 may contain a host material and a dopant material doped on the host material in order to increase light emission efficiency.

The red emission layer 130R, the green emission layer 130G, and the blue emission layer 130B may each contain a phosphorescent dopant material. Exemplary phosphorescent dopant materials for the red emission layer 130R include, but are not limited to ptOEP, $Ir(piq)_3$, $Btp_2Ir(acac)$, or the like. Exemplary phosphorescent dopant materials for the green emission layer 130G include, but are not limited to $Ir(ppy)_3$, $Ir(ppy)_2(acac)$, $Ir(mpyp)_3$, or the like. Exemplary phosphorescent dopant materials for the blue emission layer 130B include, but are not limited to $F_2Irpic$, $(F_2ppy)_2Ir(tmd)$, $Ir(dfppz)_3$, or the like.

Blue phosphorescent dopant materials may have decreased light emission efficiency or a lifespan characteristic compared to other phosphorescent materials. Thus in some embodiments, the emission layer 130 may be formed by using fluorescent blue, phosphorescent red, and phosphorescent green emission materials.

Light may be emitted in the green emission layer 130G and the red emission layer 130R while excitons transition from a triplet energy level of the dopant doped on the host material to a ground state. The excitons formed in the emission layers 130R and 130G may be leaked into the hole transport layer 170 adjacent to the emission layers 130R and 130G, particularly in the green emission layer 130G, since the triplet energy level of the material in the hole transport layer 170, adjacent to the green emission layer 130G, may be similar to the triplet energy level of the green phosphorescent dopant in the green emission layer 130G.

According to embodiments of the present disclosure, in order to prevent or reduce leaking of excitons generated in the green emission layer 130G, the exciton blocking layer 140 may be inserted between the green emission layer 130G and the hole transport layer 170.

The exciton blocking layer 140 may contain a compound represented by Chemical Formula 1 or Chemical Formula 2.

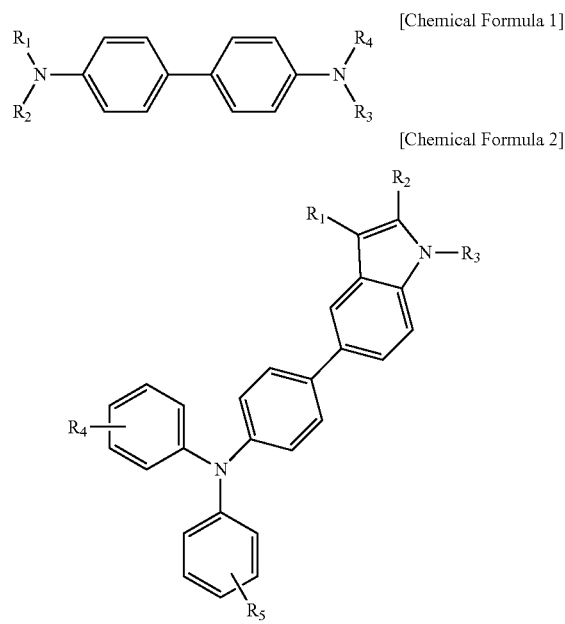

[Chemical Formula 1]

[Chemical Formula 2]

In Chemical Formula 1 and Chemical Formula 2, $R_1$ to $R_5$ may each be independently selected from the group consisting of hydrogen, deuterium, a halogen, nitro, cyano, a substituted or unsubstituted C3 to C20 heterocyclic aryl group, a fullerene, a substituted or unsubstituted C1 to C24 alkyl silyl group, and a substituted or unsubstituted C6 to C40 aryl silyl group.

Figure 5:
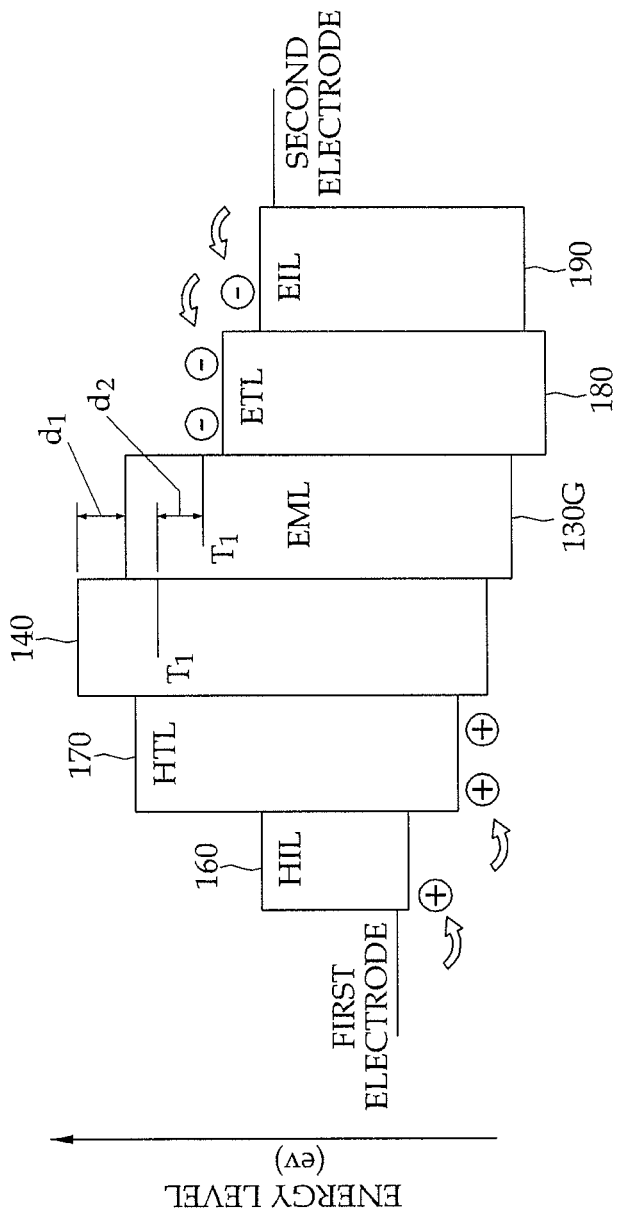
FIG. 5 is a schematic diagram illustrating an energy level of the organic light emitting device according to an exemplary embodiment of the present disclosure.

FIG. 5 is a schematic diagram showing an energy level of each layer in an exemplary embodiment of the organic light emitting device according to the present disclosure.

The holes injected from the first electrode 110 may reach the green emission layer 130G through the hole injection layer 160, the hole transport layer 170, and the exciton blocking layer 140. The electrons injected from the second electrode 120 may reach the green emission layer 130G through the electron injection layer 190 and the electron transport layer 180. The electrons and the holes may be recombined in the green emission layer 130G to generate the excitons.

Because a LUMO energy level of the exciton blocking layer 140 may be higher than the LUMO energy level of the green emission layer 130G, leaking of excitons generated in the green emission layer 130G may be prevented or reduced. As a result, the number of excitons transferred from the green emission layer 130G may be increased to improve the light emission efficiency.

According to embodiments of the present disclosure, a difference d1 between the LUMO energy level of the exciton blocking layer 140 and the LUMO energy level of the green emission layer 130G may be from 0.2 eV to 0.5 eV.

In embodiments where the difference d1 between the LUMO energy levels is less than 0.2 eV, it can be difficult to block the excitons with the exciton blocking layer 140. Therefore, the difference between the LUMO energy levels may be 0.2 eV or more.

Similarly, a triplet energy level T1 of the exciton blocking layer 140 may be higher than a triplet energy level T1 of the green emission layer 130G. Therefore, a difference d2 between the triplet energy level T1 of the exciton blocking layer 140 and the triplet energy level T1 of the green emission layer 130G may be 0.2 eV to 0.5 eV.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:
1. An organic light emitting device, comprising:
   a substrate;
   a first electrode on the substrate;
   an emission layer on the first electrode;
   a second electrode on the emission layer; and
   an exciton blocking layer between the first electrode and the emission layer,
   wherein a lowest unoccupied molecular orbital (LUMO) energy level of the exciton blocking layer is higher than a LUMO energy level of the emission layer, and
   wherein the exciton blocking layer comprises at least one compound represented by Chemical Formula:

[Chemical Formula]

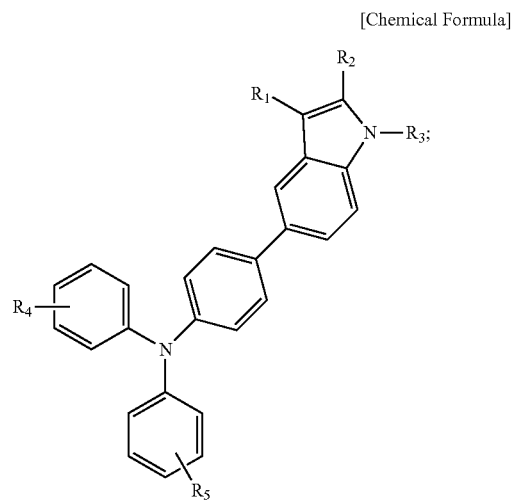

wherein in Chemical Formula, $R_1$ to $R_5$ are independently selected from the group consisting of hydrogen, deuterium, a halogen, nitro, cyano, a substituted or unsubstituted C3 to C20 heterocyclic aryl group, a fullerene, a substituted or unsubstituted C1 to C24 alkyl silyl group, and a substituted or unsubstituted C6 to C40 aryl silyl group.

2. The organic light emitting device of claim 1 wherein the exciton blocking layer is between the first electrode and a green emission layer.

3. The organic light emitting device of claim 1, further comprising a hole transport layer between the first electrode and the exciton blocking layer.

4. The organic light emitting device of claim 3, wherein a LUMO energy level of the hole transport layer is lower than the LUMO energy level of the exciton blocking layer.

5. The organic light emitting device of claim 2 wherein the difference between the LUMO energy level of the exciton blocking layer and a LUMO energy level of the green emission layer is from 0.2 eV to 0.5 eV.

6. The organic light emitting device of claim 3, wherein the difference between a LUMO energy level of the hole transport layer and the LUMO energy level of the exciton blocking layer is from 0.2 eV to 0.5 eV.

7. The organic light emitting device of claim 3, further comprising a hole injection layer between the first electrode and the hole transport layer.

8. The organic light emitting device of claim 1, further comprising at least one of an electron transport layer (ETL) between the emission layer and the second electrode or an electron injection layer (EIL) between the emission layer and the second electrode.

9. The organic light emitting device of claim 2 wherein the green emission layer comprises a phosphorescent host material having a phosphorescent dopant material doped on the phosphorescent host material.

10. The organic light emitting device of claim 9, wherein the exciton blocking layer comprises a material having a triplet energy level higher than a triplet energy level of the dopant material.

11. The organic light emitting device of claim 10, wherein the difference between the triplet energy level of the exciton blocking layer and the triplet energy level of the dopant material is from 0.2 eV to 0.5 eV.

* * * * *